(12) United States Patent
Arguel et al.

(10) Patent No.: US 8,379,223 B2
(45) Date of Patent: Feb. 19, 2013

(54) INTEGRATED MONOLITHIC INTERFERENCE DETECTION DEVICE

(75) Inventors: Philippe Arguel, Toulouse (FR);
Françoise Lozes, Castanet Tolosan (FR);
Gérard Sarrabayrouse, Mouchan (FR);
Olivier Bouchard, Lombez (FR)

(73) Assignee: Centre National de la Recherche Scientifique—CNRS, Paris (FR)

( * ) Notice: Subject to any disclaimer, the term of this patent is extended or adjusted under 35 U.S.C. 154(b) by 505 days.

(21) Appl. No.: 12/515,466

(22) PCT Filed: Nov. 21, 2007

(86) PCT No.: PCT/FR2007/001914
§ 371 (c)(1),
(2), (4) Date: Sep. 24, 2009

(87) PCT Pub. No.: WO2008/074939
PCT Pub. Date: Jun. 26, 2008

(65) Prior Publication Data
US 2010/0231924 A1    Sep. 16, 2010

(30) Foreign Application Priority Data
Nov. 21, 2006  (FR) ..................................... 06 10179

(51) Int. Cl.
*G01B 9/02* (2006.01)
(52) U.S. Cl. ........................................................ 356/521
(58) Field of Classification Search ................... 356/521
See application file for complete search history.

(56) References Cited

U.S. PATENT DOCUMENTS
4,176,276 A * 11/1979 Kaul et al. ................ 250/237 G OTHER PUBLICATIONS
A Monolithic Optical Phase-Shift Detector on Silicon, IEEE Sensors Journal, vol. 5, No. 6, Dec. 2005.*

* cited by examiner

*Primary Examiner* — Tarifur Chowdhury
*Assistant Examiner* — Jonathon Cook
(74) *Attorney, Agent, or Firm* — Arent Fox LLP

(57) ABSTRACT

The invention relates to a device (10,20) for detecting a phase difference between two light beams (8A, 8B), said device including: a diffraction grating (2) which can generate an interference field between the two light beams; and a photodiode (1,5) which is arranged to receive the interference field, said diffraction grating being integrated to the photodiode. The invention is characterized in that the diffraction grating is an amplitude grating (2).

8 Claims, 4 Drawing Sheets

INTEGRATED MONOLITHIC INTERFERENCE DETECTION DEVICE

CROSS-REFERENCE TO RELATED APPLICATION

This application is a National Stage entry of International Application No. PCT/FR2007/001914, filed Nov. 11, 2007, which claims priority to French Application No. 06/10179, filed Nov. 21, 2006, the disclosure of the prior application is incorporated in its entirety by reference.

The invention relates to a device for detecting a phase difference between two light beams, said device including:
- a diffraction grating which can generate an interference field between said two light beams;
- a photodiode which is arranged to receive said interference field;
- said diffraction grating being integrated to the photodiode.

The invention also relates to a method for manufacturing such a device.

Such a device is known from the publication "A Monolithic Optical Phase-Shift Detector on Silicon", Arguel and al., IEEE Sensors Journal, December 2005.

In this publication, the diffraction grating is a phase grating integrated into to a photodiode. In the field of microelectronics, the integration of a diffraction grating can be in the form of an etching or in the form of a deposition. In the above-mentioned publication, the phase grating is etched into the photodiode.

This phase grating includes a plurality of slots cut etched into the photodiode and it has been demonstrated, in the above mentioned publication, that on the Littrow's incidence conditions, interferences is between the two incident beams on the grating were detectable in an optimum way by the photodiode in the form of a photocurrent. The intensity of the photocurrent generated in the device of the publication is as follows $I(\Delta\phi)=A-B\cdot\cos(\Delta\phi)$, $\Delta\phi$ being the phase difference between the two beams incident on the phase grating, A and B depending on the characteristics of the incident beams and the geometric parameters of the phase grating, more particularly the height of the slots forming the grating. As per the above formula, the photocurrent intensity contrast generated in the device is thus $C=B/A$.

According to this formula, the authors of the above-mentioned publication determined that the maximum contrast which could be obtained with such a phase grating is of the order of 15% to 20%.

Now, such a contrast is not sufficient to make both direct and accurate measurements of the phase difference between the two incident beams.

The invention more particularly aims at remedying this drawback.

One of the object of the invention is thus to increase the contrast of a device such as previously described.

This object is reached by a device for detecting a phase difference between two light beams, said device including:
- a diffraction grating which can generate an interference field between said two light beams;
- a photodiode which is arranged to receive said interference field;
- said diffraction grating being integrated to the photodiode, wherein said diffraction grating is an amplitude grating.

An amplitude grating includes a succession of zones which are opaque and transparent to incident beams. Thus, the diffraction coefficients, during the transmission, in the photodiode strongly vary as a function of the phase difference between the two beams. Thus, the intensity contrast detected by the photodiode strongly increases with respect to the device integrating a phase grating such as was known in the prior art.

On the contrary, the phase gratings of the prior art did not enable this increase in the contrast.

The applicant more particularly demonstrated that the obtained contrast could reach values above 70%.

In order to make the manufacturing of the above-mentioned device simpler and to reduce the manufacturing cost thereof, the amplitude grating can be a metallic grating positioned on said photodiode. The technique of the integration by metallic deposition is well known to the persons skilled in the art in the field of microelectronics.

Still in this embodiment, the above-mentioned device includes lower and upper metallic contacts, with a voltage generator being likely to be connected between the lower and upper metallic contacts, so as to generate a potential difference within said photodiode, the amplitude grating being in electric contact with the above contacts. Thus, as the amplitude grating is metallic and as it is in contact with the upper electric contacts, the length of the diffusion of the carriers is reduced, which makes it possible to improve the measurement of the photocurrent generated in the device.

In addition, in order to facilitate the manufacturing of the above-mentioned device and to reduce the manufacturing costs thereof, said photodiode can be a p-n photodiode.

In order to enable the detection of beams for wavelengths in the visible and near infrared regions, said photodiode can be a silicon photodiode.

In order to enable the detection of beams for wavelengths in the infrared, said photodiode can be a III-V photodiode.

In both above cases, the above-mentioned device has the advantage of being suitable for measuring the phase differences as a function of the wavelength of the beams incident on the amplitude grating.

In order to obtain a correct photo-detection by the photodiode and to enable the adaptation to the incident wavelength in the above-mentioned device, said photodiode having an active region and said two beams having the same wavelength, said active region can be positioned in said photodiode, so that a photoelectric conversion of the photons at said wavelength occurs in said active region.

As a matter of fact, in such a photodiode, the detection will then be strongly improved if the photoelectric conversion occurs in the active region. The photodiode can thus be selected as a function of the wavelength to be detected to meet this condition.

The invention also relates to a manufacturing method relating to a device for detecting a phase difference between two light beams, said method including steps consisting in:
- supplying a photodiode;
- depositing or etching an amplitude grating on said photodiode.

This method has the advantage of being provided with a CMOS integration technology and thus takes advantage of the maturity and broad diffusion of this technology.

An embodiment of the invention will now be described while referring to the appended drawings wherein.

Figure 1:
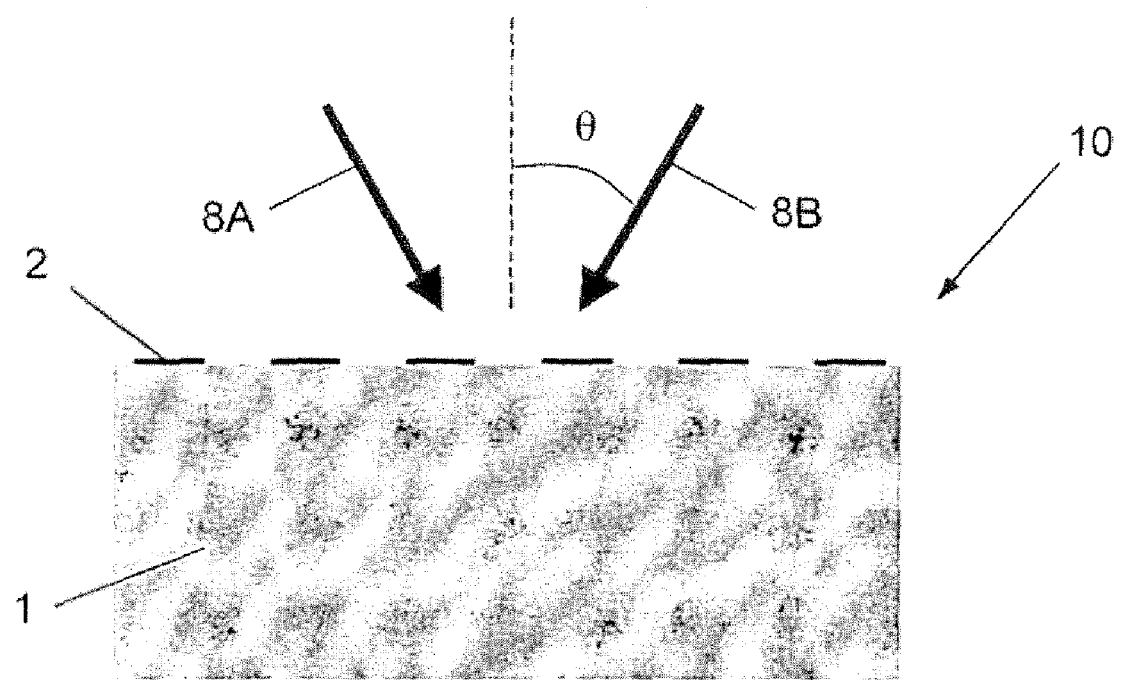
FIG. 1 illustrates a device according to one embodiment of the invention.

A device 10 according to the invention is illustrated in a general way in FIG. 1 and includes a photodiode 1 and an amplitude grating 2. The amplitude grating 2 is integrated to photodiode 1. It can be etched into or deposited on such photodiode 1. The integration of the amplitude grating 2 to photodiode 1 can be performed by an integration technique of the CMOS type, so that the device 10 forms a monolithic device. The device 10 is used for embodying an integrated micro-interferometer which can detect a phase difference between beams 8A and 8B. Beams 8A and 8B have a fixed wavelength.

The photodiode 1 is manufactured with a method using a technology of the CMOS type, as is described in the publication "A Monolithic Optical Phase-Shift Detector on Silicon", Arguel and al., IEEE Sensors Journal, December 2005.

The metallic grating is manufactured using a lithography technique, for example through the electronic writing of patterns into a PMMA resin layer. The metal layer deposited for embodying the metallic grating has a thickness which makes it opaque to the wavelength of the beams for which it is desired to determine the phase difference.

Now a device according to the invention will be described in greater details while referring to FIG. 2.

Figure 2:
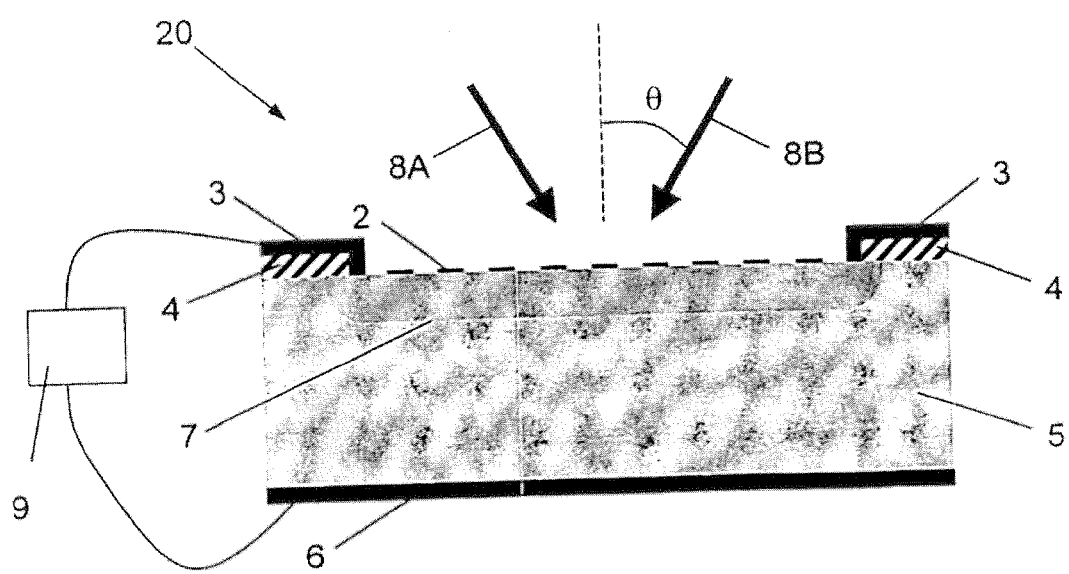
FIG. 2 illustrates in greater details a device according to one embodiment of the invention.

A device 20 according to the invention is illustrated in FIG. 2, and includes a silicon photodiode 5 including a metallic lower layer 6, a p-n junction 7, upper metallic zones 3, silicon dioxide ($SiO_2$) 4 layers. A voltage generator 9 can be connected between the upper metallic contact 3 and the lower metallic layer 6, so as to polarize the photodiode 5. In a way known per se for a photodiode, a light signal emitted towards the photodiode 5 generates a photocurrent between the metallic contacts 3 and 6, with this photocurrent being transmitted in the direction of the polarization of the photodiode such as imposed by the difference in potential generated by the voltage generator 9. Measuring this photocurrent makes it possible to obtain information on the light signal. The device 20 also includes an amplitude grating 2. As mentioned above, the photodiode 5 can be manufactured using the method described in the publication "A Monolithic Optical Phase-Shift Detector on Silicon", Arguel and al., IEEE Sensors Journal, December 2005.

The device 20 is used for embodying an integrated micro-interferometer which can detect a phase difference between beams 8A and 8B. The beams 8A and 8B have a wavelength in red light of approximately 650 nanometers with an incidence close to $\theta=30°$. The operating conditions comply with Littrow's one order, so that the value of the pitch of the grating is of the order of 0.6 micrometer. The photodiode 5 is a silicon photodiode including a p-n junction 7 defining an active zone. The position of the active zone is selected so that the photoelectric conversion occurs in the active zone.

Figure 3:
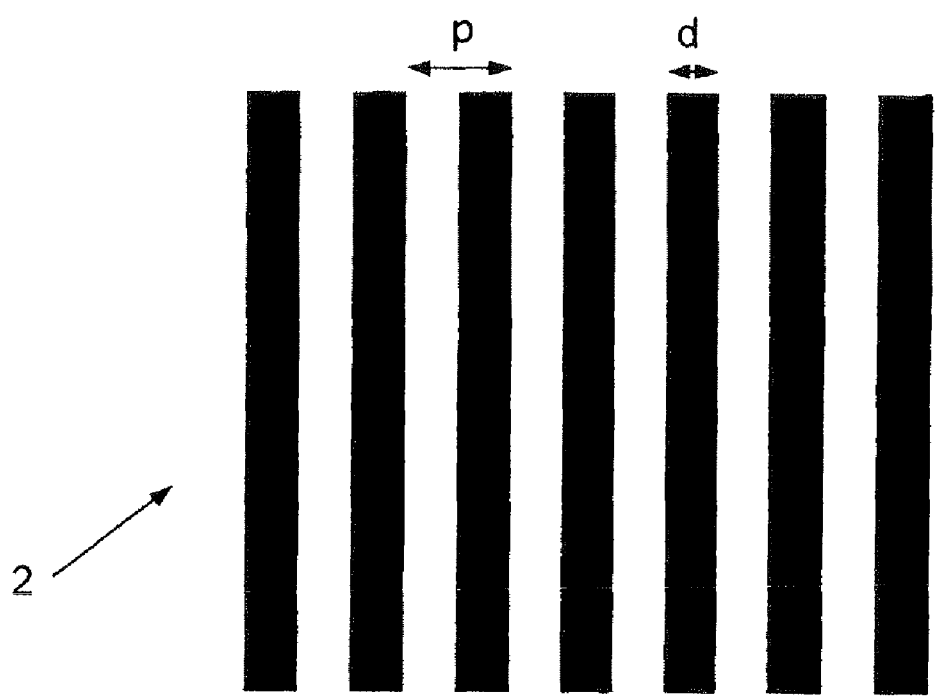
FIG. 3 illustrates a bottom view of an amplitude grating according to the invention.

The metallic grating 2 has a layer of aluminum, approximately 50 nm in thickness, obtained by cathode sputtering. The metallic grating 2 has an opening ratio of approximately 0.65 and covers approximately 95% of the active surface of the photodiode. It is manufactured using a known technique of the lift-off type. FIG. 3 illustrates a bottom view of a metallic amplitude grating 2 according to the invention, the grating 2 is a unidimensional metallic grating with a pitch p, a metal width d and an opening ratio d/p.

The detection of the phase difference of the above-mentioned device can be tested thanks to the test assembly such as described in the above-mentioned publication "A Monolithic Optical Phase-Shift Detector on Silicon", Arguel and al., IEEE Sensors Journal, December 2005. Such a test assembly makes it possible to simulate the operation of a motion optical sensor.

The electric signal collected during the tests performed by the applicant shows that the rough contrast is equal to 66.2%. This contrast can be estimated at approximately 75% for an amplitude grating totally covering the photodiode 5.

By an optimisation of the characteristics of the amplitude grating, it is even possible to obtain a contrast above 90%.

Figure 4:
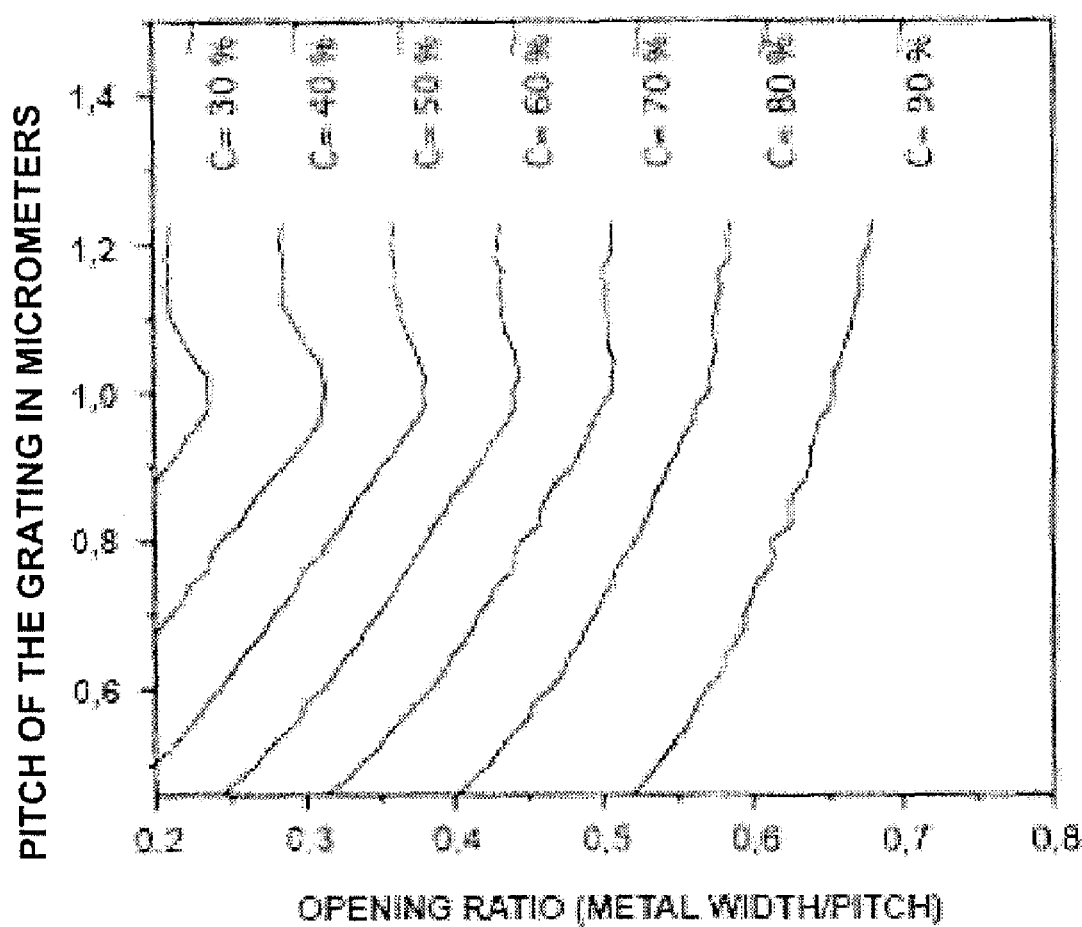
FIG. 4 illustrates the evolution of the contrast detected as a function of the opening ratio and the pitch of the amplitude grating.

The contrast obtained by the device of the invention is illustrated in FIG. 4, as a function of the pitch of the grating in micrometer and the opening ratio. The contrast in percentage is indicated in FIG. 4.

In addition, when the amplitude grating 2 is a metallic grating, it can be connected to the upper metallic zones 3. In this embodiment, the metallic amplitude grating 2 also has a function of electric contact, which makes it possible to improve the measure of the photocurrent going through the photodiode.

According to another embodiment of the invention, the amplitude grating 2 is a metallic bidimensional grating having a periodical structure of holes. Thus, it is possible to have access not only to the phase difference between two incident beams, but also to the polarizations thereof.

The invention claimed is:

1. A device (10, 20) for detecting a phase difference between two light beams, said device including:
   a diffraction grating (2) which can generate an interference field between said two light beams;
   a photodiode (1,5) which is arranged to receive the interference field;
   said diffraction grating being integrated to said photodiode, characterised in that said diffraction grating is an amplitude grating (2), wherein said amplitude grating is a metallic grating positioned on said photodiode; and
   lower (6) and upper (3) metallic contacts, a voltage generator (9) being liable to be connected between the lower (6) and upper (3) metallic contacts, so as to generate a difference in potential within said photodiode with the amplitude grating (2) being at least partially in electric contact with the upper contacts (3).

2. A device according to claim 1, wherein said amplitude grating is a uni-dimensional grating.

3. A device according to claim 1, wherein said amplitude grating is a bi-dimensional grating.

4. A device according to claim 1, wherein said photodiode is a p-n photodiode.

5. A device according to claim 1, wherein said photodiode is a III-V photodiode.

6. A device according to claim 1, wherein said photodiode is a silicon photodiode.

7. A device according to claim 1, wherein said photodiode has an active region and said two light beams have the same wavelength, said active region being positioned in said photodiode, so that a photoelectric conversion of the photons at said wavelength occurs in said active region.

8. A device according to claim 1, wherein said amplitude grating has a pitch, said pitch complying with one order Littrow's conditions.

* * * * *